(12) United States Patent
Mun

(10) Patent No.: US 11,817,291 B2
(45) Date of Patent: Nov. 14, 2023

(54) FARADAY SHIELD AND APPARATUS FOR TREATING SUBSTRATE

(71) Applicant: PSK INC., Gyeonggi-do (KR)

(72) Inventor: Mu-Kyeom Mun, Gyeonggi-do (KR)

(73) Assignee: PSK INC., Gyeonggi-Do (KR)

( * ) Notice: Subject to any disclaimer, the term of this patent is extended or adjusted under 35 U.S.C. 154(b) by 330 days.

(21) Appl. No.: 17/321,126

(22) Filed: May 14, 2021

(65) Prior Publication Data

US 2022/0230839 A1 Jul. 21, 2022

(30) Foreign Application Priority Data

Jan. 19, 2021 (KR) .......................... 10-2021-0007682

(51) Int. Cl.
*H01J 37/16* (2006.01)
*H01J 37/32* (2006.01)

(52) U.S. Cl.
CPC .......... *H01J 37/165* (2013.01); *H01J 37/321* (2013.01)

(58) Field of Classification Search
CPC .. H01J 37/165; H01J 37/321; H01J 37/32091; H01J 37/3211; H01J 37/32651; H01J 37/3244
See application file for complete search history.

(56) References Cited

U.S. PATENT DOCUMENTS

| | | | |
|---|---|---|---|
| 6,143,129 A | 11/2000 | Savas et al. | |
| 2005/0087305 A1* | 4/2005 | Nishio | H01J 37/32477 156/345.51 |
| 2008/0283500 A1* | 11/2008 | Motokawa | H01J 37/321 216/68 |
| 2011/0132540 A1* | 6/2011 | Sakka | H01L 21/67069 156/345.3 |
| 2011/0272592 A1 | 11/2011 | Kellogg et al. | |
| 2013/0196510 A1 | 8/2013 | George et al. | |
| 2020/0286712 A1* | 9/2020 | Polak | H01J 37/32651 |
| 2020/0318852 A1* | 10/2020 | Sriraman | H01J 37/32963 |

FOREIGN PATENT DOCUMENTS

| | | | | |
|---|---|---|---|---|
| CN | 104576278 A | * | 4/2010 | ........ H01J 37/32651 |
| JP | H11251303 A | | 9/1999 | |
| JP | 2001523883 A | | 11/2001 | |
| KR | 1020010032200 A | | 4/2001 | |
| KR | 20020089172 A | * | 11/2002 | ............. A47L 13/24 |

(Continued)

*Primary Examiner* — Rebecca C Bryant
*Assistant Examiner* — Christopher J Gassen
(74) *Attorney, Agent, or Firm* — Procopio, Cory, Hargreaves & Savitch LLP

(57) ABSTRACT

The inventive concept relates to an apparatus for processing a substrate. In an embodiment, the apparatus for processing the substrate includes a plasma chamber, a coil electrode installed around the plasma chamber, and a Faraday shield provided between the coil electrode and the plasma chamber. The Faraday shield includes a cutout having a plurality of slots formed in a vertical direction along a periphery of the plasma chamber, an upper rim provided at the top of the cutout, and a lower rim provided at the bottom of the cutout. The upper rim and the lower rim have a thermal expansion reduction means configured to reduce a difference in thermal deformation between the upper and the lower rim and the cutout.

16 Claims, 9 Drawing Sheets

(56) References Cited

FOREIGN PATENT DOCUMENTS

| | | | | |
|---|---|---|---|---|
| KR | 100783071 B1 | * | 12/2007 | ............ H01J 37/321 |
| KR | 100819023 B1 | * | 4/2008 | ........ H01J 37/32651 |
| KR | 101232198 B1 | * | 2/2013 | ........ H01J 37/32009 |
| KR | 101232198 B1 | | 2/2013 | |
| KR | 1020170119537 A | | 10/2017 | |
| KR | 1020200098026 A | | 8/2020 | |
| WO | WO-9615545 A1 | * | 5/1996 | ............ H01J 37/321 |
| WO | 9926267 A1 | | 5/1999 | |
| WO | WO-2008120946 A1 | * | 10/2008 | ........ H01J 37/32385 |

* cited by examiner

FIG. 2A

| Temperature(°C) | Faraday shield length(mm) | ΔL(mm) | Diameter(mm) | Δd(mm) |
|---|---|---|---|---|
| 25 | 1000 | 0 | 318.5 | 0.0 |
| 50 | 1000.6 | 0.6 | 318.7 | 0.2 |
| 100 | 1002.4 | 2.4 | 319.2 | 0.7 |
| 150 | 1005.4 | 5.4 | 320.2 | 1.7 |
| 200 | 1009.6 | 9.6 | 321.5 | 3.0 |
| 250 | 1015 | 15 | 323.2 | 4.7 |
| 300 | 1021.6 | 21.6 | 325.4 | 6.9 |

| Temperature(°C) | Faraday shield length(mm) | ΔL(mm) | Diameter(mm) | Δd(mm) |
|---|---|---|---|---|
| 25 | 1000 | 0 | 318.5 | 0.0 |
| 50 | 1000.24 | 0.24 | 318.5 | 0.0 |
| 100 | 1000.96 | 0.96 | 318.5 | 0.3 |
| 150 | 1002.16 | 2.16 | 319.2 | 0.7 |
| 200 | 1003.84 | 3.84 | 319.7 | 1.2 |
| 250 | 1006 | 6 | 320.4 | 1.9 |
| 300 | 1008.64 | 8.64 | 321.2 | 2.7 |

FARADAY SHIELD AND APPARATUS FOR TREATING SUBSTRATE

CROSS-REFERENCE TO RELATED APPLICATIONS

A claim for priority under 35 U.S.C. § 119 is made to Korean Patent Application No. 10-2021-0007682 filed on Jan. 19, 2021, in the Korean Intellectual Property Office, the entire contents of which are hereby incorporated by reference.

BACKGROUND

Embodiments of the inventive concept described herein relate to a Faraday shield and a substrate processing apparatus.

Examples of a substrate processing apparatus using plasma may include a substrate processing apparatus using inductively coupled plasma (ICP) and a substrate processing apparatus using capacitively coupled plasma (CCP).

In the case of the substrate processing apparatus using the inductively coupled plasma, not only inductive coupling but also capacitive coupling occurs between an RF coil and plasma, and an electric field like a capacitor is formed in a vertical direction in a process chamber. The capacitance of the virtual capacitor formed in the vertical direction applies, inside the process chamber, the electric field between the plasma and a wall and between the plasma and a substrate and causes charged particles constituting the plasma to be accelerated by the electric field. When the accelerated plasma particles collide with the wall or the substrate, the temperature in the process chamber and the temperature of the substrate are raised, and a surface of the substrate is damaged.

To remove the electric field in the vertical direction, a Faraday shield is provided between the process chamber and the RF coil.

An existing Faraday shield lets a magnetic field pass and blocks an electric field, thereby preventing damage to a dielectric that is generated by a potential difference between plasma and an antenna. However, as a substrate becomes larger, a plasma source also becomes larger, and a Faraday shield also becomes larger and has a sensitive influence on equipment in response to a temperature change.

Because a large-sized Faraday shield has a high thermal expansion rate and the length by which the large-sized Faraday shield is actually expanded is very great, a phenomenon such as thermal expansion or distortion occurs, and delamination (shown by a dotted line in FIG. 1), which is physical damage, occurs at a plasma source to which the Faraday shield is assembled (refer to FIG. 1).

As in FIGS. 2A and 2B, the length and diameter of a Faraday shield may be greatly changed depending on a temperature deviation. The temperature of semiconductor process equipment is actually elevated to several hundred degrees Celsius. In the case of a dielectric (Quartz, a thermal expansion rate of 0.0005 mm/° C.) that is closely attached to the Faraday shield (Al, a thermal expansion rate of 0.024 mm/° C.), the thermal expansion rate is about 1/50 of that of Al. As temperature rises and the size of the Faraday shield is increased, the dielectric is very vulnerable to damage by thermal expansion, and for the purpose of an optimized semiconductor process, a process temperature cannot be lowered. Therefore, there is difficulty in management of damage, maintenance, and manufacturing yield of a plasma source.

To solve these problems, other researchers have considered various dielectric materials and Faraday shields formed of various materials. However, a material (Cu) that is avoided in a semiconductor process or a material (Mo) that has a low thermal expansion rate, but is problematic in terms of rolling and cost generates particles at high temperature despite a low thermal expansion rate and relatively low cost. Therefore, it is difficult to change the material of a Faraday shield. Furthermore, quartz is suitable for plasma discharge due to its low dielectric constant. Accordingly, even though there is a stark difference in thermal expansion between a dielectric and a Faraday shield, it is difficult to change the material of the dielectric to a different material.

SUMMARY

Embodiments of the inventive concept provide a Faraday shield for facilitating an increase in yield of a plasma source and usage and maintenance of the plasma source, and a substrate processing apparatus including the Faraday shield.

Embodiments of the inventive concept provide a Faraday shield for minimizing thermal expansion due to high temperature, and a substrate processing apparatus including the Faraday shield.

The technical problems to be solved by the inventive concept are not limited to the aforementioned problems, and any other technical problems not mentioned herein will be clearly understood from the following description by those skilled in the art to which the inventive concept pertains.

According to an embodiment, an apparatus for processing a substrate includes a plasma chamber, a coil electrode installed around the plasma chamber, and a Faraday shield provided between the coil electrode and the plasma chamber. The Faraday shield includes a cutout having a plurality of slots formed in a vertical direction along a periphery of the plasma chamber, an upper rim provided at the top of the cutout, and a lower rim provided at the bottom of the cutout. The upper rim and the lower rim have a thermal expansion reduction means configured to reduce a difference in thermal deformation between the upper and the lower rim and the cutout.

The thermal expansion reduction means may be implemented with open regions formed in the upper rim and the lower rim.

The open regions may be implemented with circular through-holes uniformly provided in the upper rim and the lower rim.

The open regions may be provided in a slot form in the upper rim and the lower rim.

The thermal expansion reduction means may be provided in a mesh form in the upper rim and the lower rim.

The open regions may account for 40% or less of the entire area of the upper rim and the lower rim.

According to an embodiment, a Faraday shield includes a body having a hollow cylindrical shape that is open at the top and the bottom. The body includes a cutout having a plurality of slots formed in a vertical direction, an upper rim provided at the top of the cutout, and a lower rim provided at the bottom of the cutout. The upper rim and the lower rim have a thermal expansion reduction means configured to reduce a difference in thermal deformation between the upper and the lower rim and the cutout.

The thermal expansion reduction means may be implemented with open regions formed in the upper rim and the lower rim.

The open regions may be implemented with circular through-holes uniformly provided in the upper rim and the lower rim.

The open regions may be provided in a slot form in the upper rim and the lower rim.

The open regions may be formed in the upper rim and the lower rim in an oblique direction.

The thermal expansion reduction means may be provided in a mesh form in the upper rim and the lower rim.

The open regions may account for 40% or less of the entire area of the upper rim and the lower rim.

According to an embodiment, an apparatus for processing a substrate includes a housing that provides a processing space, a substrate support member that is disposed in the housing and that supports the substrate, and a plasma supply unit provided over the housing. The plasma supply unit includes a process gas supply port provided at the plasma supply unit and connected with a process gas supply tube that supplies a process gas, a plasma chamber having a discharge space formed therein, an antenna that surrounds the plasma chamber and applies plasma to the discharge space, and a Faraday shield provided between the antenna and the plasma chamber. The Faraday shield includes a cutout having a plurality of slots formed in a vertical direction along a periphery of the plasma chamber, an upper rim provided at the top of the cutout, and a lower rim provided at the bottom of the cutout. The upper rim and the lower rim have a thermal expansion reduction means configured to reduce a difference in thermal deformation between the upper and the lower rim and the cutout.

The open regions may be implemented with circular through-holes.

The open regions may be provided in an oblique slot form.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIGS. 1, 2A, and 2B are views for explaining problems of a Faraday shield in the related art;

FIG. 7 is a table showing changes in length and diameter of the Faraday shield depending on temperature.

DETAILED DESCRIPTION

Figure 1:
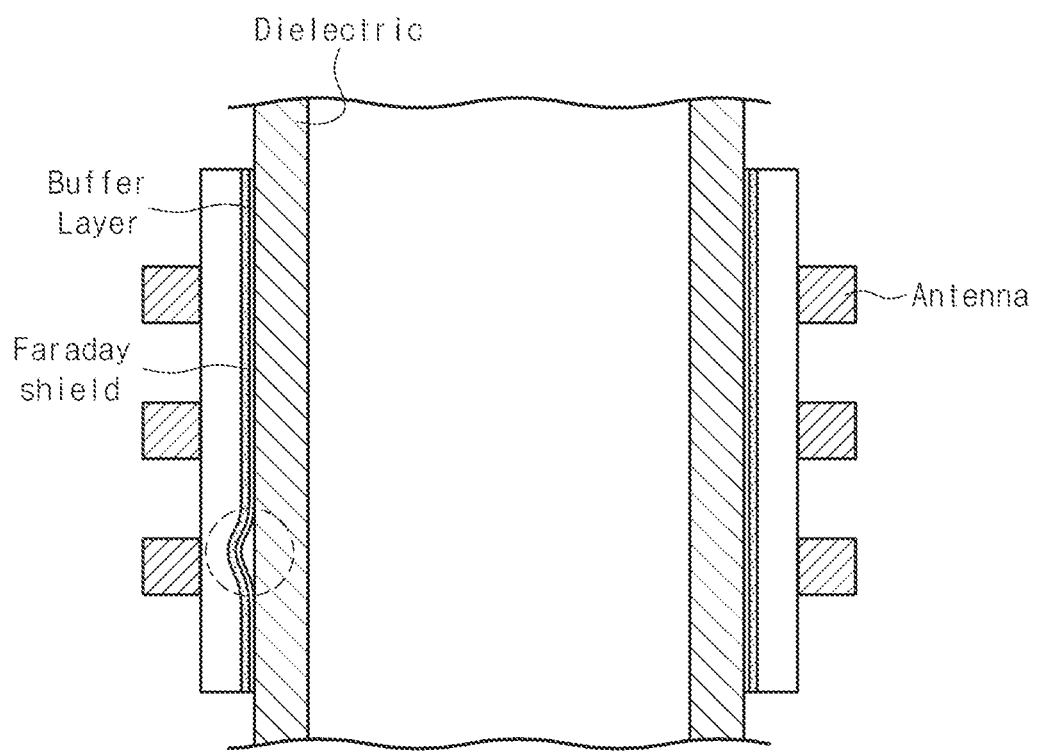

Hereinafter, embodiments of the inventive concept will be described in more detail with reference to the accompanying drawings. The inventive concept may, however, be embodied in different forms and should not be construed as limited to the embodiments set forth herein. Rather, these embodiments are provided so that the inventive concept will be thorough and complete, and will fully convey the scope of the inventive concept to those skilled in the art. In the drawings, the dimensions of components are exaggerated for clarity of illustration.

Figure 3:
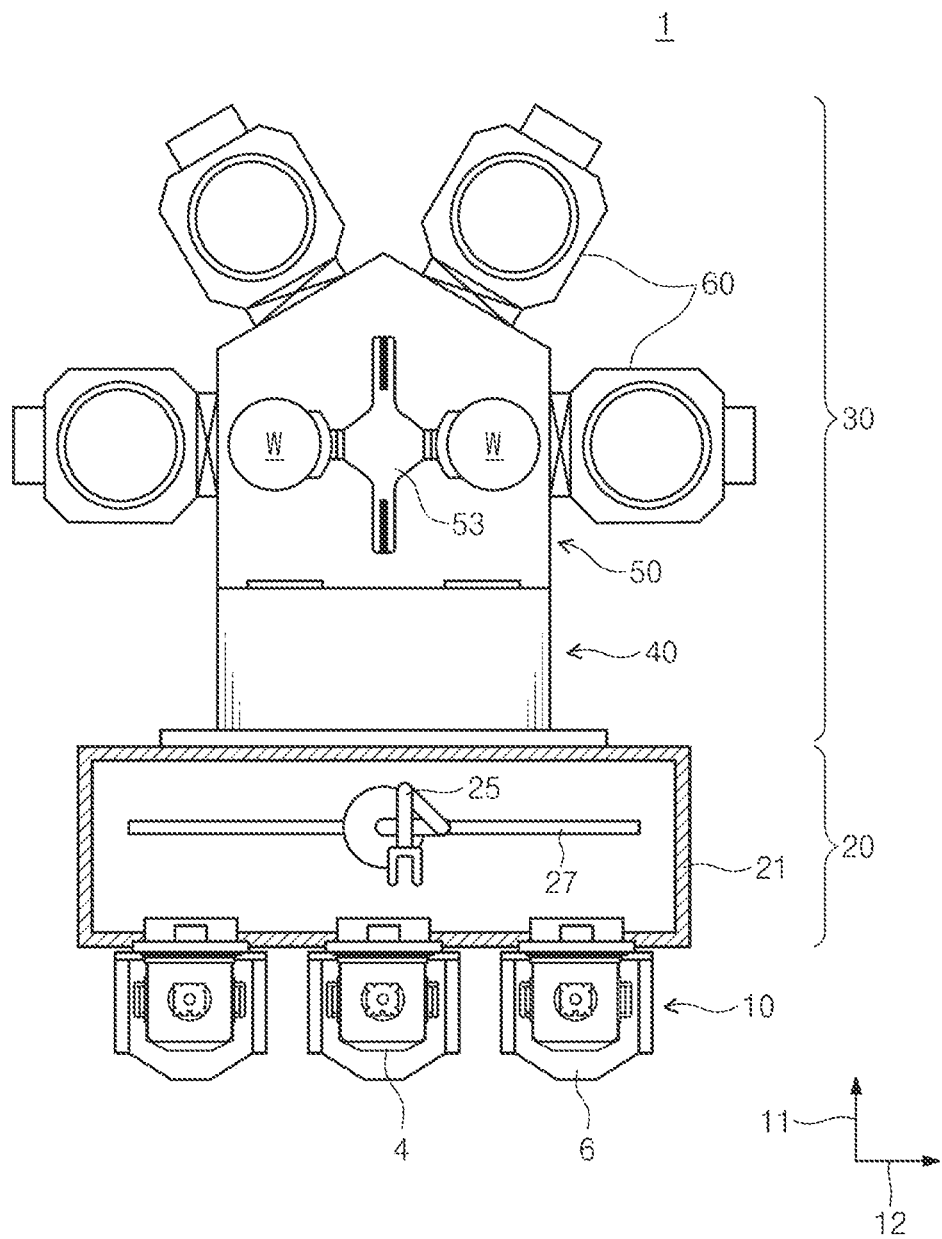
FIG. 3 is a schematic plan view illustrating substrate processing equipment according to an embodiment of the inventive concept.

FIG. 3 is a schematic plan view illustrating substrate processing equipment according to an embodiment of the inventive concept.

Referring to FIG. 3, the substrate processing equipment 1 has an equipment front end module (EFEM) 20 and a processing module 30. The equipment front end module 20 and the processing module 30 are arranged in one direction. Hereinafter, the direction which the equipment front end module 20 and the processing module 30 are arranged is referred to as the first direction 11, and the direction perpendicular to the first direction 11 when viewed from above is referred to as the second direction 12.

The equipment front end module 20 has a load port 10 and a transfer frame 21. The load port 10 is disposed at the front of the equipment front end module 20 in the first direction 11. The load port 10 has a plurality of supports 6. The supports 6 are arranged in a row in the second direction 12, and carriers 4 (e.g., cassettes, FOUPs, or the like) containing substrates W to be processed and completely processed substrates W are located on the supports 6. The substrates W to be processed and the completely processed substrates W are received in the carriers 4. The transfer frame 21 is disposed between the load port 10 and the processing module 30. The transfer frame 21 includes an index robot 25 that is disposed inside the transfer frame 21 and that transfers the substrates W between the load port 10 and the processing module 30. The index robot 25 moves along a transport rail 27 in the second direction 12 to transfer the substrates W between the carriers 4 and the processing module 30.

The processing module 30 includes a load-lock chamber 40, a transfer chamber 50, a plurality of process chambers 60, and a controller 70.

The load-lock chamber 40 is disposed adjacent to the transfer frame 21. For example, the load-lock chamber 40 may be disposed between the transfer chamber 50 and the equipment front end module 20. The load-lock chamber 40 provides a space in which the substrates W to be processed stand by before transferred to the process chambers 60 or a space in which the completely processed substrates W stand by before transferred to the equipment front end module 20.

The transfer chamber 50 is disposed adjacent to the load-lock chamber 40. The transfer chamber 50 has a polygonal body when viewed from above. The load-lock chamber 40 and the plurality of process chambers 60 are disposed on the exterior of the body along the periphery of the body. The body has, in sidewalls thereof, passages (not illustrated) through which the substrates W enter or exit the body, and the passages connect the transfer chamber 50 and the load-lock chamber 40 or the process chambers 60. Doors (not illustrated) are provided for the respective passages to open/close the passages and hermetically seal the interior of the body. A transfer robot 53 that transfers the substrates W between the load-lock chamber 40 and the process chambers 60 is disposed in the interior space of the transfer chamber 50. The transfer robot 53 transfers the unprocessed substrates W standing by in the load-lock chamber 40 to the process chambers 60, or transfers the completely processed substrates W to the load-lock chamber 40. Furthermore, the transfer robot 53 transfers the substrates W between the process chambers 60 to sequentially or simultaneously provide the substrates W to the plurality of process chambers 60.

The process chambers 60 may be disposed around the transfer chamber 50. The plurality of chambers 60 may be provided. In the process chambers 60, processes are performed on the substrates W. The process chambers 60 process the substrates W transferred from the transfer robot 53 and provide the completely processed substrates W to the transfer robot 53. The processes performed in the respective process chambers 60 may differ from one another. The process performed by each of the process chambers 60 may be one of processes of manufacturing a semiconductor device or a display panel using the substrate W.

The substrates W processed by the equipment have a comprehensive meaning including a substrate used to manufacture a semiconductor device, a substrate used to manufacture a flat panel display (FPD), and a substrate used to manufacture an object having a circuit pattern formed on a thin film thereof. Examples of the substrates W include a silicon wafer, a glass substrate, an organic substrate, and the like.

Figure 4:
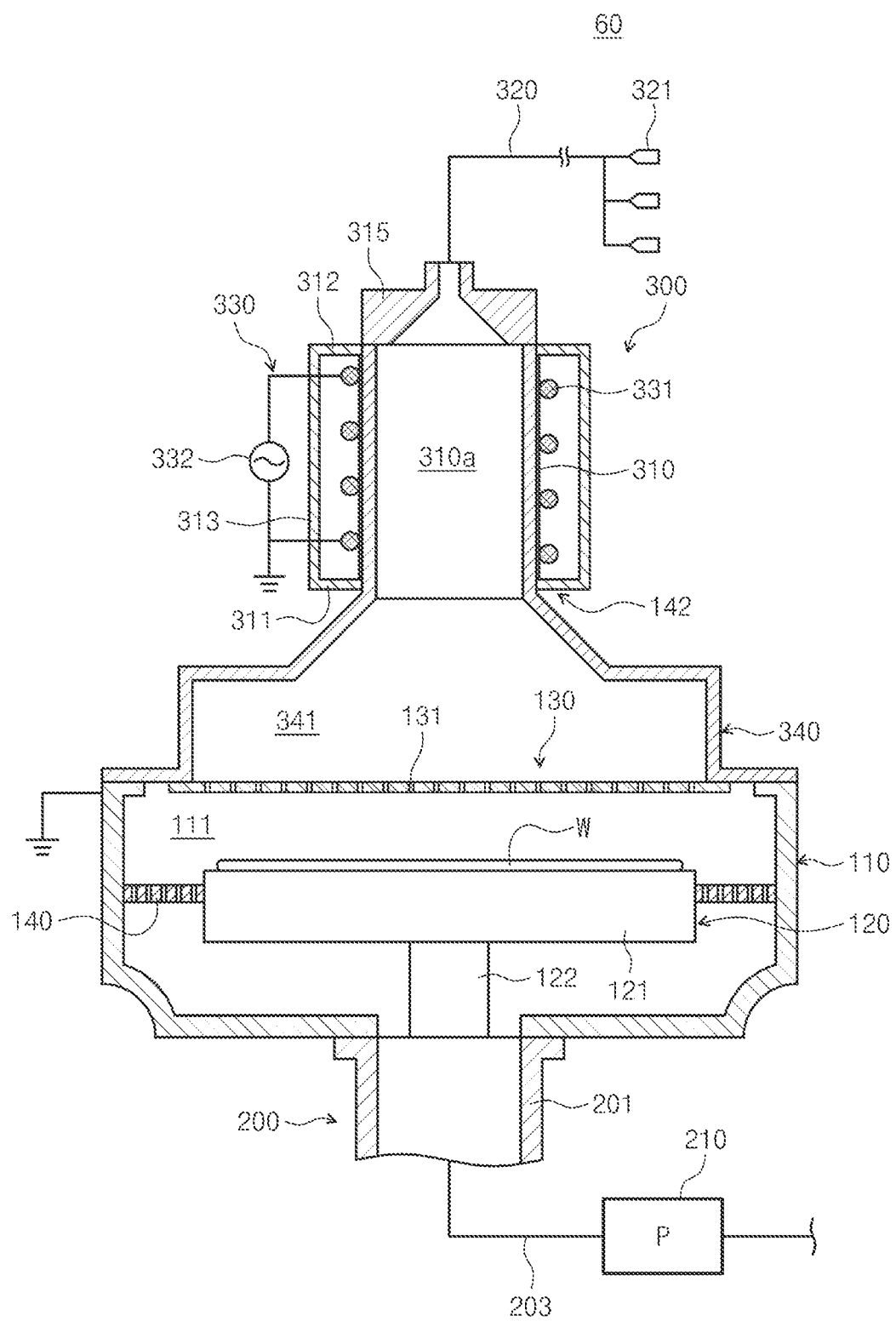
FIG. 4 is a schematic side sectional view illustrating a process chamber according to an embodiment of the inventive concept.

FIG. 4 is a schematic side sectional view illustrating a process chamber according to an embodiment of the inventive concept. The process chamber is a substrate processing apparatus that processes a surface of a substrate W with plasma.

Referring to FIG. 4, the process chamber 60 may include a process unit 100, an exhaust unit 200, and a plasma supply unit 300.

The process unit 100 is a space in which the substrate W is processed. The process unit 100 may include a housing 110, a substrate support member 120, and a baffle 130.

The housing 110 provides a processing space 111 in which a substrate processing process is performed. The substrate support member 120 is provided in the processing space 111, and the substrate W to be processed is placed on an upper surface of the substrate support member 120. The substrate W enters and exits the housing 110 through an opening. The opening may be opened and closed by an opening/closing member such as a door (not illustrated).

The substrate support member 120 supports the substrate W. The substrate support member 120 includes a support plate 121 and a support shaft 122. The support plate 121 is located in the processing space 111 and has a circular plate shape. The support plate 121 is supported by the support shaft 122. The substrate W is placed on an upper surface of the support plate 121.

The baffle 130 is located over the support plate 121. The baffle 130 may be electrically connected to an upper wall of the housing 110. The baffle 130 may have a circular plate shape and may be disposed parallel to the upper surface of the substrate support member 120. The baffle 130 may be formed of anodized aluminum. The baffle 130 has throughholes 131 formed therein. The through-holes 131 may be formed on concentric circumferences at predetermined intervals to uniformly supply radicals. Plasma diffused in a diffusion space 341 is introduced into the processing space 111 through the through-holes 131. For example, at this time, charged particles such as electrons or ions may be confined in the baffle 130, and neutral particles, such as oxygen radicals, which have no electrical charge may be supplied to the substrate W through the through-holes 131. Furthermore, the baffle 130 may be grounded to form a passage through which electrons or ions move.

A lower baffle 140 is provided on a lower side of the process unit 100. The lower baffle 140 may be provided around the support plate 121. The lower baffle 140 may have a shape similar to that of the baffle 130. The lower baffle 140 may adjust the time during which plasma remains in the processing space 111. Reaction by-products passing through the lower baffle 140 are discharged outside the process unit 100 through an exhaust port 201.

The exhaust unit 200 includes the exhaust port 201 and a depressurizing pump 210. The exhaust port 201 is connected with the depressurizing pump 210 that pumps the reaction by-products to adjust the pressure in the process unit 100.

The exhaust port 201 is connected with an exhaust hole formed in the bottom of the housing 110. The exhaust port 201 provides a passage through which plasma and reaction by-products staying in the housing 110 are discharged to the outside. The exhaust port 201 is connected to an exhaust tube 203. The exhaust tube 203 is connected to the depressurizing pump 210. The exhaust port 210 may be provided around the support plate 121.

The plasma supply unit 300 is located over the process unit 100 and over the housing 110. The plasma supply unit 300 is separate from the process unit 100 and is provided outside the process unit 100. The plasma supply unit 300 generates plasma from a process gas and supplies the plasma into the processing space 111 of the process unit 100.

The plasma supply unit 300 may include a plasma chamber 310, a process gas supply tube 320, a power supply member 330, a diffusion member 340, and a Faraday shield 400.

The plasma chamber 310 has a discharge space 310a formed therein. An upper end of the plasma chamber 310 is hermetically sealed by a process gas supply port 315. The process gas supply port 315 is connected with the process gas supply tube 320. The process gas is a reaction gas for generation of plasma. The reaction gas is supplied into the discharge space 310a through the process gas supply port 315. For example, the reaction gas may include difluoromethane ($CH_2F_2$), nitrogen ($N_2$), and oxygen ($O_2$). Selectively, the reaction gas may further include a different type of gas such as tetrafluoromethane ($CF_4$).

The power supply member 330 supplies RF power to the discharge space 310a. The power supply member 330 may include an antenna 331 and a power source 332. The antenna 331 is an inductively coupled plasma (ICP) antenna and has a coil shape. The antenna 331 is wound around the plasma chamber 310 a plurality of times. The antenna 331 is wound around a region of the plasma chamber 310 that corresponds to the discharge space 310a. One end of the antenna 331 is connected with the power source 332, and an opposite end of the antenna 331 is grounded.

A source part including the antenna 331 and the plasma chamber 310 is provided as one module surrounded by a first plate 311, a second plate 312, and a third plate 313. The plasma chamber 310 may be formed of a dielectric (e.g., ceramic, quartz, or the like). The first plate 311, the second plate 312, and the third plate 313 may be formed of a metallic material.

The power source 332 supplies an RF current to the antenna 331. The RF power supplied to the antenna 331 is applied to the discharge space 310a. An induced electric field is formed in the discharge space 310a by the RF current, and the process gas supplied into the discharge space 310a obtains energy required for ionization from the induced electric field and is converted into a plasma state.

The structure of the power supply member 330 is not limited to the above-described embodiment, and various structures for generating plasma from the process gas may be used.

A lower end of the plasma chamber 310 is connected with the diffusion member 340. The diffusion member 340 is located between the plasma chamber 310 and the housing 110. The diffusion member 340 hermetically seals an open upper surface of the housing 110, and the housing 110 and the baffle 130 are coupled to a lower end of the diffusion member 340. The diffusion space 341 is formed inside the diffusion member 340. The diffusion space 341 connects the discharge space 310a and the processing space 111 and serves as a passage through which plasma generated in the discharge space 310a is supplied into the processing space 111.

Figure 5:
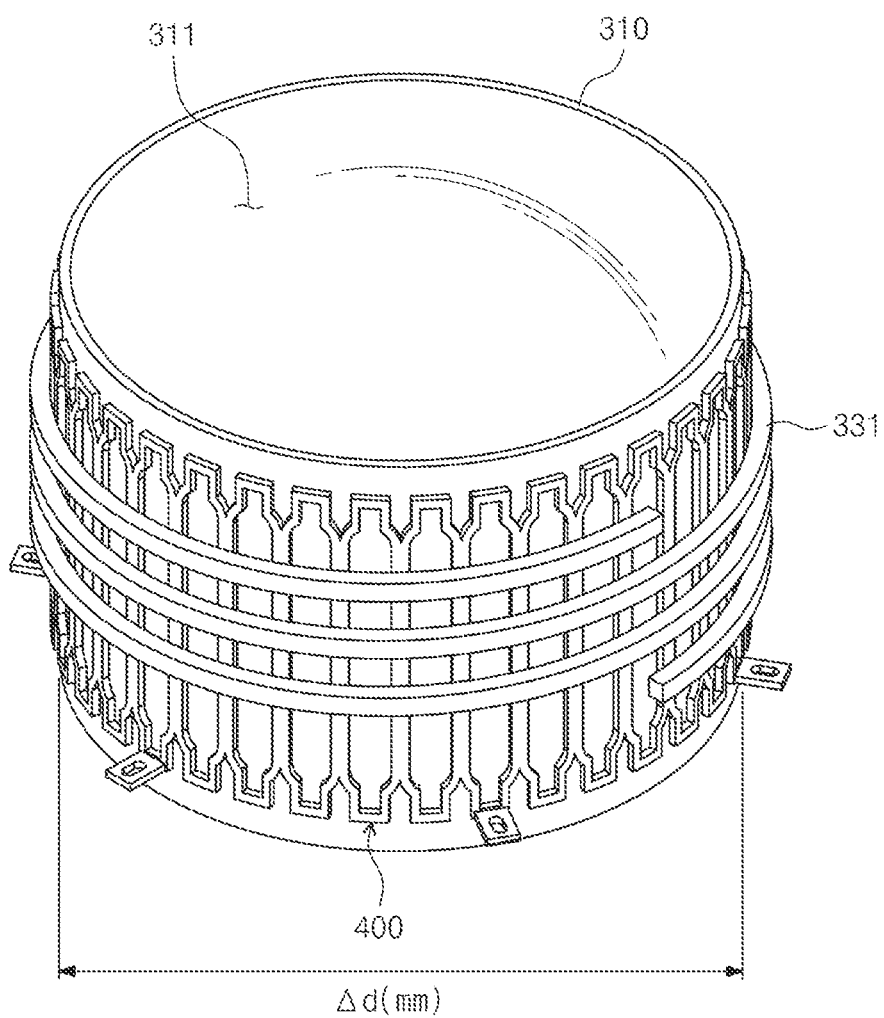
FIG. 5 is a view illustrating a Faraday shield mounted on a plasma chamber.
Figure 6:
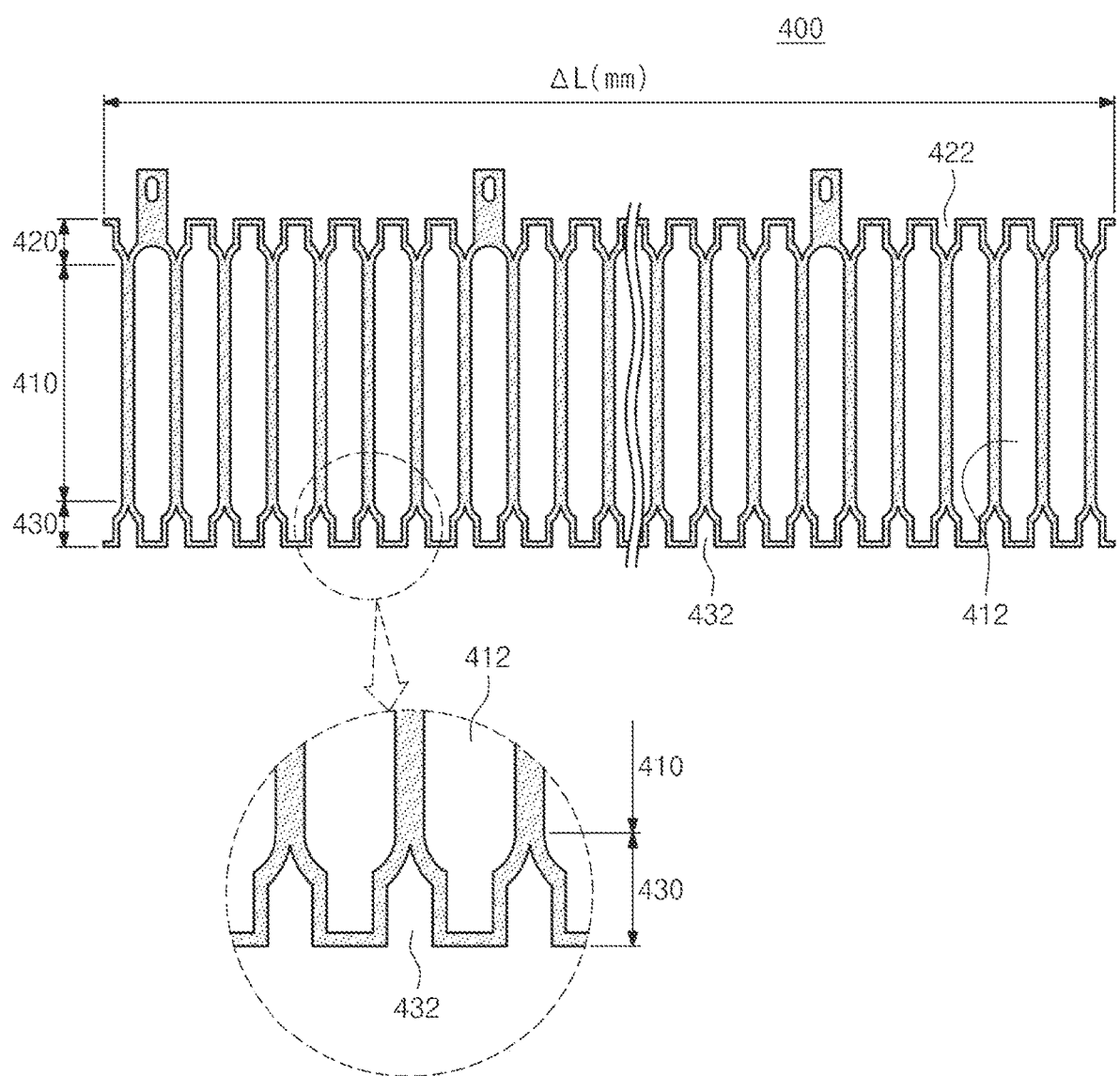
FIG. 6 is a plan view of the Faraday shield illustrated in FIG. 5.

FIG. 5 is a view illustrating the Faraday shield mounted on the plasma chamber. FIG. 6 is a plan view of the Faraday shield illustrated in FIG. 5. FIG. 7 is a table showing changes in length and diameter of the Faraday shield depending on temperature.

Referring to FIGS. 4 to 7, the Faraday shield 400 shields part of an electric field applied into the discharge space 310a by power supplied to the antenna 331. The Faraday shield 400 is located between the plasma chamber 310 and the antenna 331 and surrounds a side surface of the plasma chamber 310. The length of the Faraday shield 400 in an up/down direction corresponds to the distance from an upper end to a lower end of a region surrounding a side surface of the discharge space 310a of the antenna 331. The Faraday shield 400 may be grounded through the housing 110. Selectively, the Faraday shield 400 may be directly connected to a separate ground line. The Faraday shield 400 is formed of a metallic material to shield the electric field. For example, the Faraday shield 400 may be formed of an aluminum (Al) material.

The Faraday shield 400 may be divided into an upper rim 420, a lower rim 430, and a cutout 410 between the upper rim 420 and the lower rim 430. The cutout 410 includes a plurality of slots 412 formed in a vertical direction along the periphery of the plasma chamber 310. The upper rim 420 may be provided at the top of the cutout 410, and the lower rim 430 may be provided at the bottom of the cutout 410.

The upper rim 420 may include a thermal expansion reduction means for reducing a difference in thermal deformation between the upper rim 420 and the cutout 410, and the lower rim 430 may include a thermal expansion reduction means for reducing a difference in thermal deformation between the lower rim 430 and the cutout 410. The thermal expansion reduction means may be implemented with open regions 422 and 432 formed in the upper rim 420 and the lower rim 430. The open regions 422 and 432 preferably account for 40% or less of the entire area of the upper rim 420 and the lower rim 430. The differences in thermal deformation may be minimized as the areas of the open regions 422 and 432 are increased.

As described above, by lowering metal filling rates at the upper rim 420 and the lower rim 430 that are irrelevant to electromagnetic interference shielding, the Faraday shield 400 has a structure in which the entire length is the same, but an actual expansion rate of the same material is low even though thermal expansion occurs.

Figure 2B:
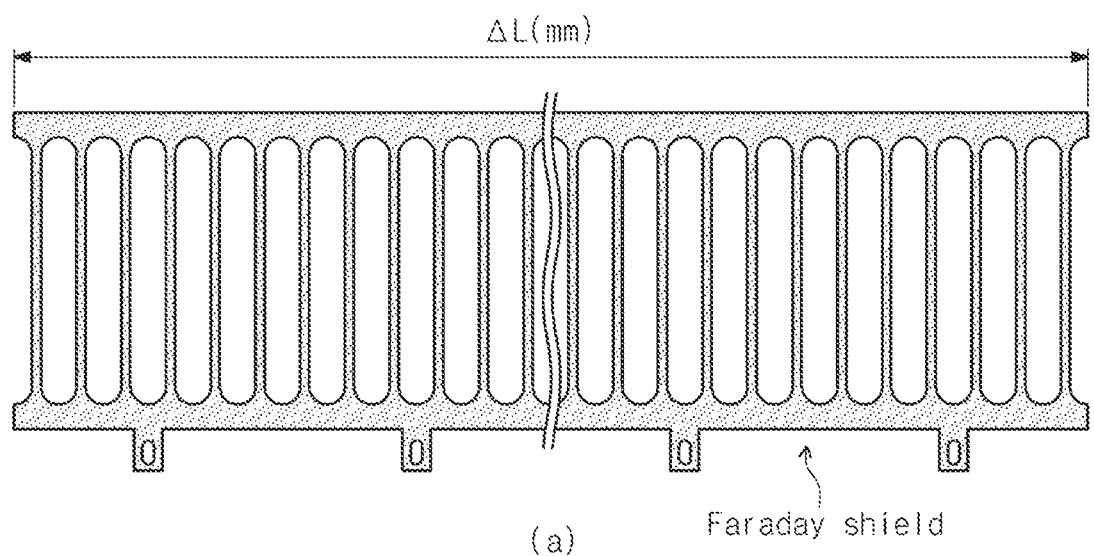
Figure 2B:
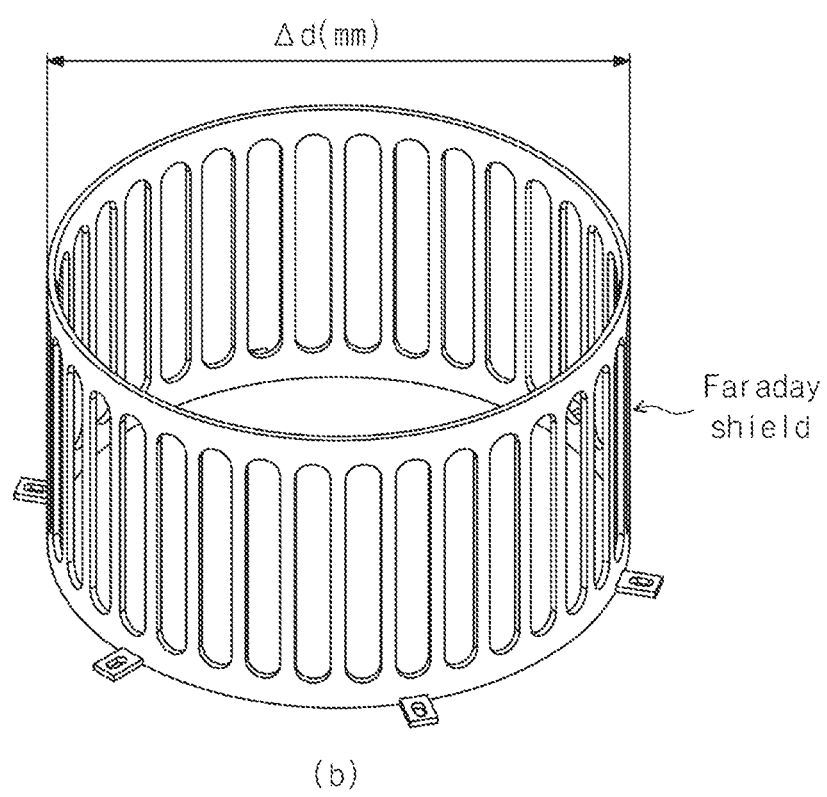

Referring to FIGS. 7 and 2A, comparing the Faraday shield in the related art that has a filling rate of 100% and the Faraday shield of the inventive concept that has a relatively low filling rate, it can be seen that even though temperature rises, the expansion rate (change) is significantly low and when the Faraday shield of the inventive concept is applied to an actual plasma source, durability and production yields are improved.

Figure 8:
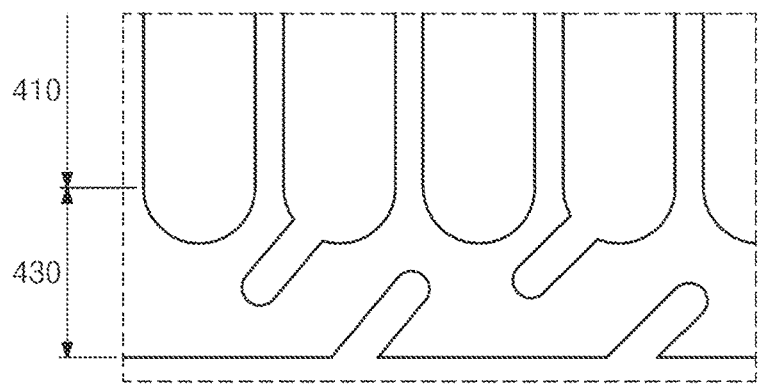
FIGS. 8 to 10 are views illustrating various modified examples of the Faraday shield.
Figure 9:
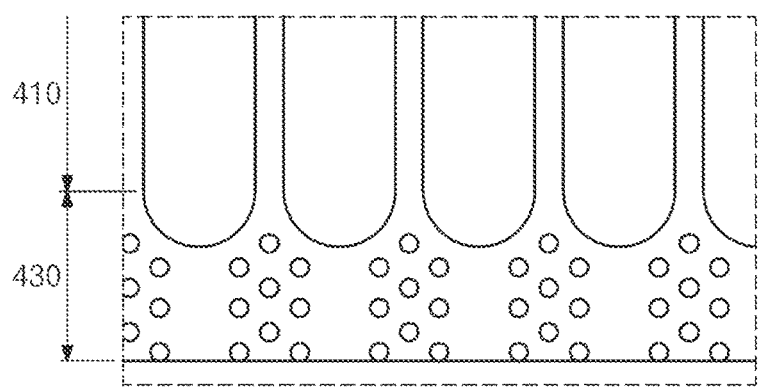
Figure 10:
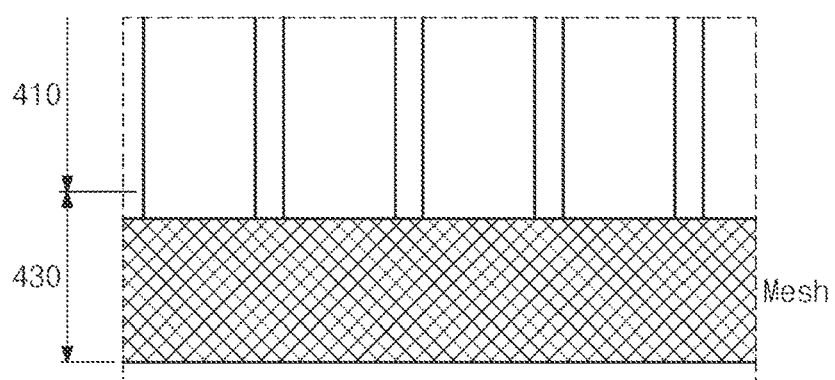

FIGS. 8 to 10 are views illustrating various modified examples of the Faraday shield. For convenience, upper rims are not illustrated in FIGS. 8 to 10. Open regions may have various shapes (a circular shape, a quadrilateral shape, a triangular shape, and the like) capable of decreasing filling rates of rims.

As illustrated in FIG. 8, open regions formed in an upper rim 420 and a lower rim 430 of a Faraday shield 400a may have an oblique slot shape.

As illustrated in FIG. 9, open regions formed in an upper rim 420 and a lower rim 430 of a Faraday shield 400b may have a through-hole shape.

As illustrated in FIG. 10, thermal expansion reduction means of a Faraday shield 400c may be provided in a mesh form in an upper rim 420 and a lower rim 430.

According to the embodiments of the inventive concept, the Faraday shield and the substrate processing apparatus including the same may facilitate an increase in yield of the plasma source and usage and maintenance of the plasma source.

Effects of the inventive concept are not limited to the above-described effects, and any other effects not mentioned herein may be clearly understood from this specification and the accompanying drawings by those skilled in the art to which the inventive concept pertains.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for processing a substrate, the apparatus comprising:
   a plasma chamber;
   a coil electrode installed around the plasma chamber; and
   a Faraday shield provided between the coil electrode and the plasma chamber,
   wherein the Faraday shield includes a cutout having a plurality of slots formed in a vertical direction along a periphery of the plasma chamber, an upper rim provided at a top of the cutout, and a lower rim provided at a bottom of the cutout, and
   wherein the upper rim and the lower rim have a thermal expansion reducer configured to reduce a difference in thermal deformation between the upper and the lower rim and the cutout.

2. The apparatus of claim 1, wherein the thermal expansion reducer is implemented with open regions formed in the upper rim and the lower rim.

3. The apparatus of claim 2, wherein the open regions are implemented with circular through-holes uniformly provided in the upper rim and the lower rim.

4. The apparatus of claim 2, wherein the open regions are provided in a slot shape in the upper rim and the lower rim.

5. The apparatus of claim 2, wherein the open regions account for 40% or less of the entire area of an upper rim and the lower rim.

6. The apparatus of claim 1, wherein the thermal expansion reducer is provided in a mesh shape in the upper rim and the lower rim.

7. A Faraday shield comprising:
   a body having a hollow cylindrical shape that is open at a top and a bottom,
   wherein the body includes a cutout having a plurality of slots formed in a vertical direction, an upper rim provided at the top of the cutout, and a lower rim provided at the bottom of the cutout, and
   wherein the upper rim and the lower rim have a thermal expansion reducer configured to reduce a difference in thermal deformation between the upper and the lower rim and the cutout.

8. The Faraday shield of claim 7, wherein the thermal expansion reducer is implemented with open regions formed in the upper rim and the lower rim.

9. The Faraday shield of claim 8, wherein the open regions are implemented with circular through-holes uniformly provided in the upper rim and the lower rim.

10. The Faraday shield of claim 8, wherein the open regions are provided in a slot shape in the upper rim and the lower rim.

11. The Faraday shield of claim 10, wherein the open regions are formed in the upper rim and the lower rim in an oblique direction.

12. The Faraday shield of claim 8, wherein the open regions account for 40% or less of an entire area of the upper rim and the lower rim.

13. The Faraday shield of claim 7, wherein the thermal expansion reducer is provided in a mesh shape in the upper rim and the lower rim.

14. An apparatus for processing a substrate, the apparatus comprising:
   a housing configured to provide a processing space;
   a substrate support member disposed in the housing and configured to support the substrate; and
   a plasma supply unit provided over the housing,
   wherein the plasma supply unit includes:
   a process gas supply port provided at the plasma supply unit and connected with a process gas supply tube configured to supply a process gas;
   a plasma chamber having a discharge space formed therein;
   an antenna configured to surround the plasma chamber and apply plasma to the discharge space; and
   a Faraday shield provided between the antenna and the plasma chamber,
   wherein the Faraday shield includes a cutout having a plurality of slots formed in a vertical direction along a periphery of the plasma chamber, an upper rim provided at a top of the cutout, and a lower rim provided at a bottom of the cutout, and
   wherein the upper rim and the lower rim have a thermal expansion reducer configured to reduce a difference in thermal deformation between the upper and the lower rim and the cutout.

15. The apparatus of claim 14, wherein the thermal expansion reducer is implemented with open regions formed in the upper rim and the lower rim, and
   wherein the open regions are implemented with circular through-holes.

16. The apparatus of claim 14, wherein the thermal expansion reducer is implemented with open regions formed in the upper rim and the lower rim, and
   wherein the open regions are provided in an oblique slot shape.

* * * * *